United States Patent
Kwon et al.

(10) Patent No.: US 10,566,245 B2
(45) Date of Patent: Feb. 18, 2020

(54) METHOD OF FABRICATING GATE ALL AROUND SEMICONDUCTOR DEVICE

(71) Applicant: SAMSUNG ELECTRONICS CO., LTD., Suwon-si, Gyeonggi-Do (KR)

(72) Inventors: Tae Yong Kwon, Suwon-si (KR); Oh Seong Kwon, Hwaseong-si (KR)

(73) Assignee: SAMSUNG ELECTRONICS CO., LTD., Suwon-si, Gyeonggi-Go (KR)

( * ) Notice: Subject to any disclaimer, the term of this patent is extended or adjusted under 35 U.S.C. 154(b) by 0 days.

(21) Appl. No.: 15/854,343

(22) Filed: Dec. 26, 2017

(65) Prior Publication Data
US 2018/0315667 A1    Nov. 1, 2018

Related U.S. Application Data

(60) Provisional application No. 62/490,344, filed on Apr. 26, 2017.

(51) Int. Cl.
*H01L 21/8238*     (2006.01)
*H01L 27/092*      (2006.01)
(Continued)

(52) U.S. Cl.
CPC .. *H01L 21/823842* (2013.01); *H01L 21/0274* (2013.01); *H01L 21/31144* (2013.01);
(Continued)

(58) Field of Classification Search
CPC ......... H01L 21/823842; H01L 21/0274; H01L 21/31144; H01L 21/823885; H01L 27/092;
(Continued)

(56) References Cited

U.S. PATENT DOCUMENTS 9,263,338 B2 *   2/2016   Liu ................. H01L 21/823487
9,443,856 B2     9/2016   Ching et al.
(Continued)

*Primary Examiner* — Peter Bradford
(74) *Attorney, Agent, or Firm* — F. Chau & Associates, LLC

(57) ABSTRACT

A method of fabricating a gate all around semiconductor device is provided. The method includes: providing a semiconductor substrate having a plurality of active fins extending in a first direction in a first region and a second region next to the first region, a plurality of gate all around channels stacked above each of the plurality of active fins, and a plurality of gate openings extending in a second direction across the first and second regions and crossing the plurality of active fins, in which the plurality of gate openings include cave-like gate spaces between each of the plurality of active fins and one adjacent gate all around channel and between two adjacent gate all around channels, forming a dielectric layer in the first and second regions on bottom and sidewalls of each of the plurality of gate openings, and on and surrounding each of the plurality of gate all around channels and filling a first portion of each of the cave-like gate spaces, forming first work function metal in the first and second regions on the dielectric layer with the first work function metal filling a second portion of each of the cave-like gate spaces, forming first carbon-based mask in the first and second regions by a chemical vapor deposition (CVD) process to fill the plurality of gate openings to a height at least covering all the plurality of gate all around channels, forming second carbon-based mask in the first and second regions on top of the first carbon-based mask to a height above the plurality of gate openings, removing the first and second carbon-based masks in the second region, removing the first work function metal in the second region through etching using remaining first and second carbon-based masks in the first region as an etching mask, removing the remaining first and second carbon-based masks in the first (Continued)

region, and forming second work function metal on the dielectric layer in the second region, and on the first work function metal in the first region.

17 Claims, 9 Drawing Sheets

(51) Int. Cl.
H01L 29/78 (2006.01)
H01L 29/49 (2006.01)
H01L 21/027 (2006.01)
H01L 21/311 (2006.01)
H01L 29/423 (2006.01)

(52) U.S. Cl.
CPC .... H01L 21/823885 (2013.01); H01L 27/092 (2013.01); H01L 29/42392 (2013.01); H01L 29/4966 (2013.01); H01L 29/7827 (2013.01)

(58) Field of Classification Search
CPC ........... H01L 29/42392; H01L 29/4966; H01L 29/7827
See application file for complete search history.

(56) References Cited

U.S. PATENT DOCUMENTS

| 9,450,046 | B2 | 9/2016 | Wen et al. |
| 9,502,414 | B2 | 11/2016 | Machkaoutsan et al. |
| 9,508,712 | B2* | 11/2016 | Wahl ..................... H01L 27/088 |
| 9,660,033 | B1* | 5/2017 | Chen ................... H01L 29/1054 |
| 10,103,065 | B1* | 10/2018 | Mochizuki ...... H01L 21/823842 |
| 2012/0306026 | A1 | 12/2012 | Guo et al. |
| 2015/0262828 | A1* | 9/2015 | Brand ............ H01L 21/823842 438/592 |
| 2016/0190339 | A1 | 6/2016 | Xie et al. |
| 2016/0204195 | A1* | 7/2016 | Wen ................... H01L 21/02532 257/347 |
| 2017/0033106 | A1 | 2/2017 | Walke et al. |
| 2017/0040321 | A1 | 2/2017 | Mitard |
| 2018/0019242 | A1* | 1/2018 | Liao .................... H01L 27/0924 |
| 2018/0031549 | A1* | 2/2018 | Chen ................ G01N 33/54346 |

* cited by examiner

METHOD OF FABRICATING GATE ALL AROUND SEMICONDUCTOR DEVICE

CROSS-REFERENCE TO RELATED APPLICATION

This application claims the benefit under 35 U.S.C. § 119(e) of U.S. Provisional Patent Application No. 62/490,344, filed on Apr. 26, 2017 in the United States Patent & Trademark Office, the disclosure of which is incorporated by reference herein in its entirety.

TECHNICAL FIELD

The present disclosure relates generally to a method of fabricating a gate all around semiconductor device, and a structure of the gate all around semiconductor device.

DISCUSSION OF RELATED ART

As semiconductor devices continue to increase their chip density and speed, the size of the transistors has been steadily reduced accordingly. For a planar transistor, as its size decreases, the likelihood of causing short channel effects increases. To address this issue, the semiconductor industry has migrated to a multi-gate device, and has also shifted from the planar structure to a three-dimensional (3D) architectures such as fin field effect transistor (FinFET), which is a multi-gate 3D transistor that offers better performance and more energy efficiency compared to existing planar devices. For a FinFET, a thin silicon fin is wrapped around by two or more gates to provide better electrical control over the channel and thus help in reducing the leakage current and overcoming the short-channel effects.

As the size of the transistor continues to shrink, FinFET devices face new challenges, such as, for example, channel width variations, parasitic capacitance and parasitic resistance. Gate all around transistors have emerged as promising candidates for replacing FinFET devices in future technology generations. With a gate placed all around four sides of a channel, the transistor offers superior electrostatic control, thereby enabling complementary metal-oxide-semiconductor (CMOS) device scaling.

In general, to fabricate a CMOSFET, a work function metal (WFM) of an n-type FET (NFET) and a WFM of a p-type FET (PFET) constituting a CMOS are deposited. In a planar FET or a FinFET, depositing each WFM for each of NFET and PFET may be carried out with a photolithographic process and an anisotropic etching process. However, when fabricating FETs with gate all around structure, in which several channels are vertically arranged on a substrate, since the channels may block the etchant to reach the caves filled with the carbon-based material used in the photolithography process, anisotropic etching process may be difficult to carry out. Therefore, depositing each WFM for each of NFET and PFET for gate all around structure may require a different fabrication process from existing ones.

SUMMARY

According to an aspect of the present disclosure, there is provided a method of fabricating a gate all around semiconductor device including: providing a semiconductor substrate having a plurality of active fins extending in a first direction in a first region and a second region next to the first region, a plurality of gate all around channels stacked above each of the plurality of active fins, and a plurality of gate openings extending in a second direction across the first and second regions and crossing the plurality of active fins, in which the plurality of gate openings include cave-like gate spaces between each of the plurality of active fins and one adjacent gate all around channel and between two adjacent gate all around channels; forming a dielectric layer in the first and second regions on bottom and sidewalls of each of the plurality of gate openings, and on and surrounding each of the plurality of gate all around channels and filling a portion of each of the cave-like gate spaces; forming first work function metal in the first and second regions on the dielectric layer with the first work function metal filling a portion of each of the cave-like gate spaces; forming first carbon-based mask in the first and second regions by a chemical vapor deposition (CVD) process to fill the plurality of gate openings to a height at least covering all the plurality of gate all around channels; forming second carbon-based mask in the first and second regions on top of the first carbon-based mask to a height above the plurality of gate openings; removing the first and second carbon-based masks in the second region; removing the first work function metal in the second region through etching using remaining first and second carbon-based masks in the first region as an etching mask; removing the remaining first and second carbon-based masks in the first region; and forming second work function metal on the dielectric layer in the second region, and on the first work function metal in the first region.

According to another aspect of the present disclosure, there is provided a method of fabricating a gate all around semiconductor device including: providing a semiconductor substrate having a plurality of gate openings extending across a first region and a second region next to the first region, and a plurality of gate all around channels stacked above the semiconductor substrate in each of the plurality of gate openings, in which the plurality of gate openings include cave-like gate spaces between the semiconductor substrate and adjacent gate all around channels and between two adjacent gate all around channels; forming a dielectric layer in the first and second regions on bottom and sidewalls of each of the plurality of gate openings, and on and surrounding each of the plurality of gate all around channels and filling a portion of each of the cave-like gate spaces; forming first work function metal in the first and second regions on the dielectric layer with the first work function metal filling a portion of each of the cave-like gate spaces, and leaving a gap with a size larger than or equal to 1 nm for each of the cave-like gate spaces between two adjacent gate all around channels covered with the first work function metal; forming first carbon-based mask in the first and second regions by a chemical vapor deposition (CVD) process to fill the plurality of gate openings to a height at least covering all the plurality of gate all around channels; forming second carbon-based mask in the first and second regions on top of the first carbon-based mask to a height above the plurality of gate openings with planarized top surface; removing the first and second carbon-based masks in the second region through a photolithography process and an anisotropic etching process; removing the first work function metal in the second region through etching using remaining first and second carbon-based masks in the first region as an etching mask; removing the remaining first and second carbon-base masks in the first region; and forming second work function metal on the dielectric layer in the second region, and on the first work function metal in the first region.

According to another aspect of the present disclosure, there is provided a gate all around semiconductor device including: a semiconductor substrate having a p-type field effect transistor (PFET) region and an n-type field effect transistor (NFET) region next to the PFET region; a vertical stack of gate all around channels on the semiconductor substrate in the PFET and NFET regions; a dielectric layer formed on and surrounding each of the gate all around channels in the PFET rand NFET regions; a p-type work function metal formed on and surrounding the dielectric layer of each of the gate all around channels in the PFET region; and an n-type work function metal formed on and surrounding the dielectric layer of each of the gate all around channels in the NFET region, in which the n-type work function metal includes multilayers with one layer including a material of the p-type work function metal and having a thickness in a range of 1 to 8 nm, and space between one of the gate all around channels including the p-type work function metal in the PFET region and an adjacent one of the gate all around channels including the n-type work function metal in the NFET region has a size smaller than two times of a size including half width of the gate all around channel, thickness of the dielectric layer, and thickness of the p-type work function metal.

By depositing the first work function metal to surround the gate all around channels and to fill the cave-like gate spaces while leaving a gap with a size larger than or equal to 1 nm for each of the cave-like gate spaces, and by depositing the first carbon-based mask to the gate all around structure by a chemical vapor deposition (CVD) process so as not to fill the cave-like gate spaces or to fill very little, the complementary metal-oxide-semiconductor (CMOS) device patterning may be enabled.

BRIEF DESCRIPTION OF THE DRAWINGS

The present disclosure may best be understood from the following detailed description of preferred embodiments, taken in conjunction with the accompany drawings, and in which.

Figure 1:
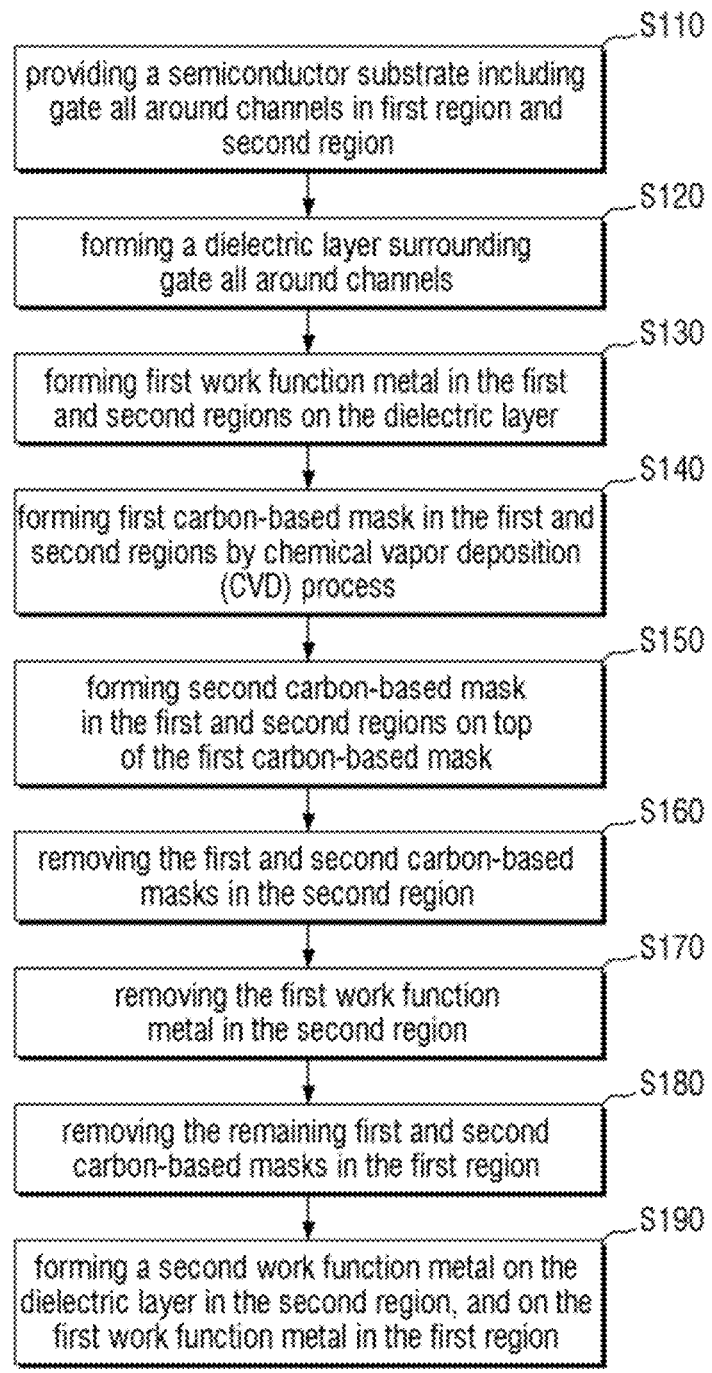
FIG. 1 is a flow chart of a method of fabricating a gate all around semiconductor device according to an example of the present disclosure.

Since the drawings in FIGS. 1-9 are intended for illustrative purpose, the elements in the drawings are not necessarily drawn to scale. For example, some of the elements may be enlarged or exaggerated for clarity purpose.

DETAILED DESCRIPTION OF THE EMBODIMENTS

The present disclosure relates generally to a method of fabricating a gate all around semiconductor device, and a structure of the gate all around semiconductor device.

According to an example of the present disclosure, a method of forming p-type work function metal (WFM) in the p-type field effect transistor (PFET) region and n-type WFM in the n-type FET (NFET) region for the gate all around semiconductor device is provided. When fabricating FETs with gate all around structure, in which several channels are vertically arranged on a substrate, since the channels may block the etchant to reach the cave-like gate spaces filled with the carbon-based material used in the photolithography process, anisotropic etching process may be difficult to carry out. In addition, when the cave-like gate spaces are completely filled with a first WFM material, it may be difficult to remove the first WFM with an anisotropic etching process.

According to an example of the present disclosure, a method of depositing the first WFM and a carbon-based mask not to fill up the cave-like spaces, so that the anisotropic etching may be successfully carried out in the process of fabricating the gate all around semiconductor device is provided. Accordingly, the present disclosure will resolve the fabricating issue associated with etching process in forming the p-type WFM in the PFET region and the n-type WFM in the NFET region for a gate all around semiconductor device. Example embodiments of the present disclosure provide a method of fabricating a gate all around semiconductor device, for example, a FinFET, by depositing a carbon-based mask, which can be subsequently etched easily, using a chemical vapor deposition (CVD) process to the gate all around structure to enable complementary metal-oxide-semiconductor (CMOS) device patterning, and a method of fabricating a gate all around semiconductor device by depositing the first WFM to surround the gate all around channels and to fill the cave-like gate spaces while leaving a gap with a size of larger than or equal to 1 nm for each of the cave-like gate spaces for subsequently easy etching of the carbon-based masks and the first WFM to enable the CMOS device patterning. Thus, gate all around semiconductor devices with reduced sizes may be fabricated.

It will be understood that when an element such as a layer, region or substrate is referred to as being "on" or "over" another element, it can be directly on or over the other element or intervening elements may also be present. In contrast, when an element is referred to as being "directly on" or "directly over" another element, there are no intervening elements present. As used herein, the singular forms "a", "an" and "the" are intended to include the plural forms as well, unless the context clearly indicates otherwise.

According to an example of the present disclosure, a method of fabricating a gate all around semiconductor device may include the following steps: providing a semiconductor substrate having a plurality of active fines extending in a first direction in a first region and a second region next to the first region, a plurality of gate all around channels stacked above each of the plurality of active fins, and a plurality of gate openings extending in a second direction across the first and second regions and crossing the plurality of active fins, in which the plurality of gate openings include cave-like gate spaces between each of the plurality of active fins and an adjacent gate all around channel and between two adjacent gate all around channels; forming a dielectric layer in the first and second regions on bottom and sidewalls of each of the plurality of gate openings, and on and surrounding each of the plurality of gate all around channels and filling a portion of each of the cave-like gate spaces; forming first work function metal in the first and second regions on the dielectric layer with the first work function metal filling a portion of each of the cave-like gate spaces; forming first carbon-based mask in the first and second regions by a chemical vapor deposition (CVD) process to fill the plurality of gate openings to a height at least covering all the plurality of gate all around channels; forming second carbon-based mask in the first and second regions on top of the first carbon-based mask to a height above the plurality of gate openings; removing the first and second carbon-based masks in the second region; removing the first work function metal in the second region through etching using remaining first and second carbon-based masks in the first region as an etching mask; removing the remaining first and second carbon-based masks in the first region; and forming second work function metal on the dielectric layer in the second region, and on the first work function metal in the first region. However, the present disclosure is not limited to the performance of these steps with the sequence or order presented above. Many steps may also be applied to the substrate before, between or after the steps shown above.

FIG. 1 is a flow chart of the method of fabricating a gate all around semiconductor device.

Figure 2:
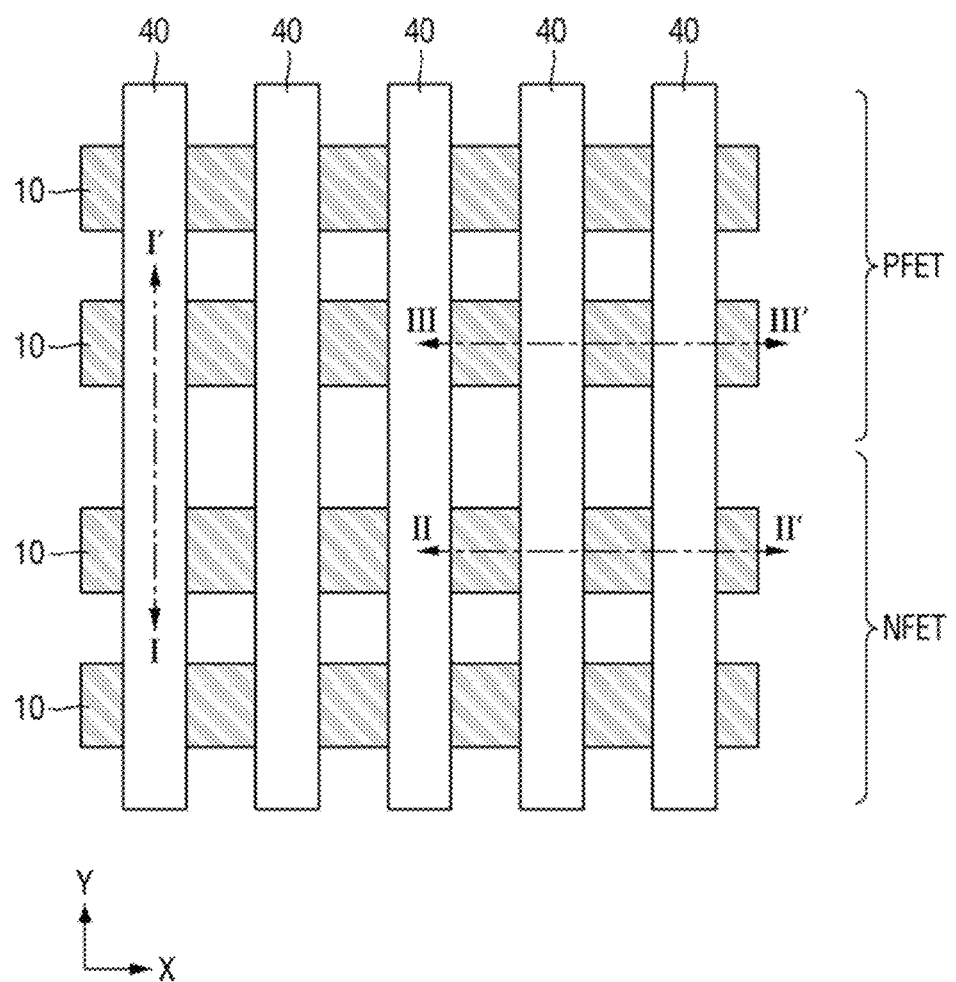
FIG. 2 is a schematic top-view diagram representing a gate all around semiconductor device according to an example of the present disclosure.

FIG. 2 is a schematic top-view diagram representing a gate all around semiconductor device according to an example of the present disclosure.

Figure 3:
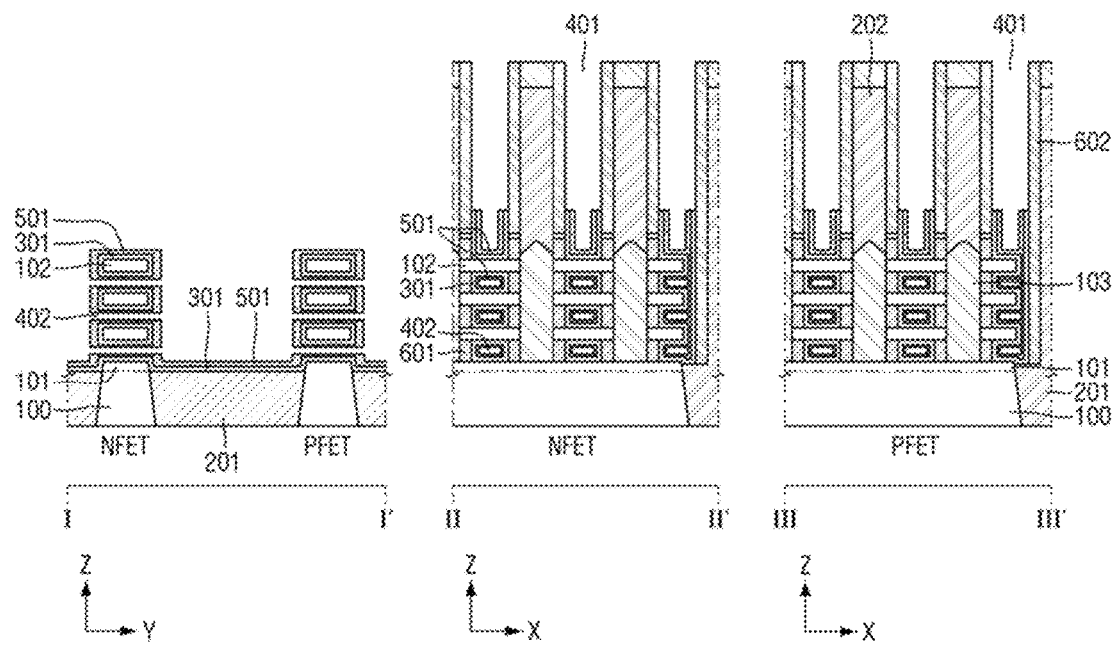
FIG. 3 is a schematic cross-sectional diagram representing a plurality of gate all around channels stacked on the substrate with a dielectric layer formed surrounding the gate all around channels and first work function metal formed on the dielectric layer according to an example of the present disclosure.

FIG. 3 is a schematic cross-sectional diagram representing a plurality of gate all around channels stacked on the substrate with a dielectric layer formed surrounding the gate all around channels and first work function metal formed on the dielectric layer according to an example of the present disclosure.

Referring to FIG. 1 through FIG. 3, at Block S110 of FIG. 1, a semiconductor substrate including gate all around channels in first region and second region may be provided. As shown in FIGS. 2 and 3, the provided semiconductor substrate 100 may have a plurality of active fin structures 10 (or active fins 101) extending in a first direction (X direction) in a first region and a second region next to the first region, and a plurality of gate structures 40 (or gate openings 401) extending in a second direction (Y direction) across the first and second regions and crossing the plurality of active fin structures 10. The first region is exemplified as PFET region and the second region is exemplified as NFET region. However, the present disclosure is not limited thereto. For example, the first region may be the NFET region and the second region may be the PFET region. The plurality of active fins 101 are part of the semiconductor substrate 100 and protrude upwards in a third direction (Z direction) perpendicular to the first and second directions (X and Y directions).

FIG. 3 includes three cross-sectional views of the gate all around semiconductor device taken along lines I-I', II-II' and III-III' of FIG. 2. As shown in FIG. 3, the provided semiconductor substrate 100 may have a plurality of gate all around channels 102 vertically stacked in the third direction (Z direction) above each of the plurality of active fins 101, and a plurality of gate openings 401 extending in a second direction (Y direction) across the first and second regions (PFET and NFET regions), and crossing the plurality of active fins 101, in which the plurality of gate openings 401 include cave-like gate spaces 402 between each of the active fins 101 and an adjacent gate all around channel 102 and between two adjacent gate all around channels 102. The gate all around channels 102 are the channels for the gate all around FETs. The gate all around FET may be a MOSFET.

The semiconductor substrate 100 may include a semiconducting material, such as, for example, silicon (Si), germanium (Ge), silicon germanium (SiGe), silicon carbide (SiC), gallium nitride (GaN) or gallium arsenide (GaAs), and may also include a non-semiconducting material such as, for example, silicon oxide ($SiO_2$), aluminum (Al), aluminum oxide ($Al_2O_3$), ceramic, quartz, or copper (Cu). The semiconductor substrate 100 may include multilayers, for example, germanium on silicon, or silicon on insulator (SOI). For some applications, the semiconductor substrate 100 may be a semiconductor substrate doped with impurities to render them p-type or n-type. In a p-doped silicon substrate, the Si substrate may be doped with p-type dopants such as, for example, boron (B), aluminum (Al), gallium (Ga) and indium (In). In an n-doped silicon substrate, the Si substrate may be doped with n-type dopants such as, for example, antimony (Sb), arsenic (As) and phosphorous (P). The semiconductor substrate 100 may include one or more semiconductor layers or structures and may include active or operable portions of semiconductor devices. The active or operable portions of the semiconductor devices may include transistors. The gate all around channels 102 vertically stacked on the semiconductor substrate 100 may include silicon nanowires. In some instances, the gate all around channels 102 may include, for example, germanium (Ge), Indium gallium arsenide (InGaAs) or other III-V materials.

Within the semiconductor substrate 100 and/or around the active fins 101, the gate all around semiconductor device may include shallow trench isolation (STI) structures 201. The STI structures 201 may include an insulation material such as, for example, silicon oxide ($SiO_2$), silicon oxynitride (SiON), or the like. Source/drains 103 may be formed on both sides of each gate opening 401. The source/drains 103 may include a semiconductor layer doped with an impurity. In an example of the present disclosure, the source/drains 103 may include, for example, silicon (Si), silicon germanium (SiGe), or silicon carbide (SiC) doped with an impurity.

The source/drains 103 may include a semiconductor layer epitaxially grown from the active fins 101 of the semiconductor substrate 100. First spacers 601 and second spacers 602 may be formed on the sidewalls of the gate openings 401. The first spacers 601 may be mainly formed in contact with the source/drains 103 and between adjacent gate all around channels 102, while the second spacers 602 may be mainly formed in contact with the STI structures 201 or next to inter-gate insulating layers 202. However, the first and second spacers 601 and 602 may be formed as an integer part and may be indistinguishable. The first and second spacers 601 and 602 may include, for example, silicon nitride (SiN), silicon oxynitride (SiON), or a combination thereof.

At Block S120 of FIG. 1, a dielectric layer 301 surrounding gate all around channels 102 may be formed. As shown in FIG. 3, the dielectric layer 301 may be formed in the first and second regions (PFET and NFET regions) on bottom and sidewalls of each of the plurality of gate openings 401, and on and surrounding each of the plurality of gate all around channels 102 and filling a portion of each of the cave-like gate spaces 402. Thus, each of the cave-like gate spaces 402 becomes smaller. The dielectric layer 301 may only be formed on the sidewalls of the gate openings 401 at the lower portion near the gate all around channels 102, but the present disclosure is not limited thereto. For example, the dielectric layer 301 may also be formed on the sidewalls of the gate openings 401 at the upper portion. In addition, an oxidation layer may be formed between the active fins 101 and the dielectric layer 301, and between the gate all around channels 102 and the dielectric layer 301, and may include an insulation material such as, for example, silicon oxide ($SiO_2$), silicon oxynitride (SiON), or the like. However, the present disclosure is not limited thereto.

The dielectric layer 301 may include, for example, a silicon oxide layer, a high-k dielectric layer, or a combination thereof. The high-k dielectric layer may include a material having a dielectric constant greater than that of a silicon oxide layer, for example, having a dielectric constant of about 10 to about 25. For example, the high-k dielectric layer may include at least one of hafnium oxide ($HfO_2$), hafnium oxynitride (HfON), hafnium silicon oxide ($HfSiO_x$), lanthanum oxide ($La_2O_3$), lanthanum aluminum oxide ($LaAlO_3$), zirconium oxide ($ZrO_2$), zirconium silicon oxide ($ZrSi_xO_y$), tantalum oxide ($Ta_2O_5$), titanium oxide ($TiO_2$), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb_2ScTaO_6$), lead zinc niobate ($Pb(Zn_{1/3}Nb_{2/3})O_3$), and combinations thereof, but the present disclosure is not limited thereto. The dielectric layer 301 may be formed by, for example, an atomic layer deposition (ALD) process, a chemical vapor deposition (CVD) process, or a physical vapor deposition (PVD) process.

At Block S130 of FIG. 1, first work function metal (WFM) 501 may be formed in the first and second regions (PFET and NFET regions) on the dielectric layer 301. As shown in FIG. 3, the first WFM 501 may be formed in the first and second regions (PFET and NFET regions) on the dielectric layer 301 with the first WFM 501 filling one other portion of each of the cave-like gate spaces 402. Thus, each of the cave-like gate spaces 402 becomes even smaller.

The first WFM 501 may be p-type WFM (PWFM), but the present disclosure is not limited thereto. For example, the first WFM 501 may be n-type WFM (NWFM). PWFM may include, for example, tungsten nitride (WN), ruthenium nitride (RuN), molybdenum nitride (MoN), titanium nitride (TiN), tantalum nitride (TaN), titanium aluminum nitride (TiAlN), tantalum aluminum nitride (TaAlN), tungsten carbide (WC), tantalum carbide (TaC), or titanium carbide (TiC), but the present disclosure in not limited thereto. NWFM may include, for example, titanium aluminide (TiAl), zirconium aluminide (ZrAl), tungsten aluminide (WAl), tantalum aluminide (TaAl), hafnium aluminide (HfAl), or titanium aluminum carbide (TiAlC), but the present disclosure is not limited thereto. The first WFM 501 may be PWFM, and may include, for example, titanium nitride (TiN). The first WFM 501 may be formed by, for example, an atomic layer deposition (ALD) process, a chemical vapor deposition (CVD) process, or a physical vapor deposition (PVD) process.

After the first WFM 501 is formed on the dielectric layer 301, a gap (distance) of each of the cave-like gate spaces 402 between two adjacent gate all around channels 102 covered with the first WFM 501 may be about 1 nm or larger. In an example of the present disclosure, the gap (distance) of each of the cave-like gate spaces 402 between two adjacent gate all around channels 102 covered with the first WFM 501 may be in a range of about 1 nm to 8 nm. For example, the gap may be in a range of about 1 nm to 5 nm. The gap may allow etchants to reach the inner portion of the cave-like gate spaces 402 to remove the first WFM 501 formed within the cave-like gate spaces 402 in a subsequent etching step.

Figure 4:
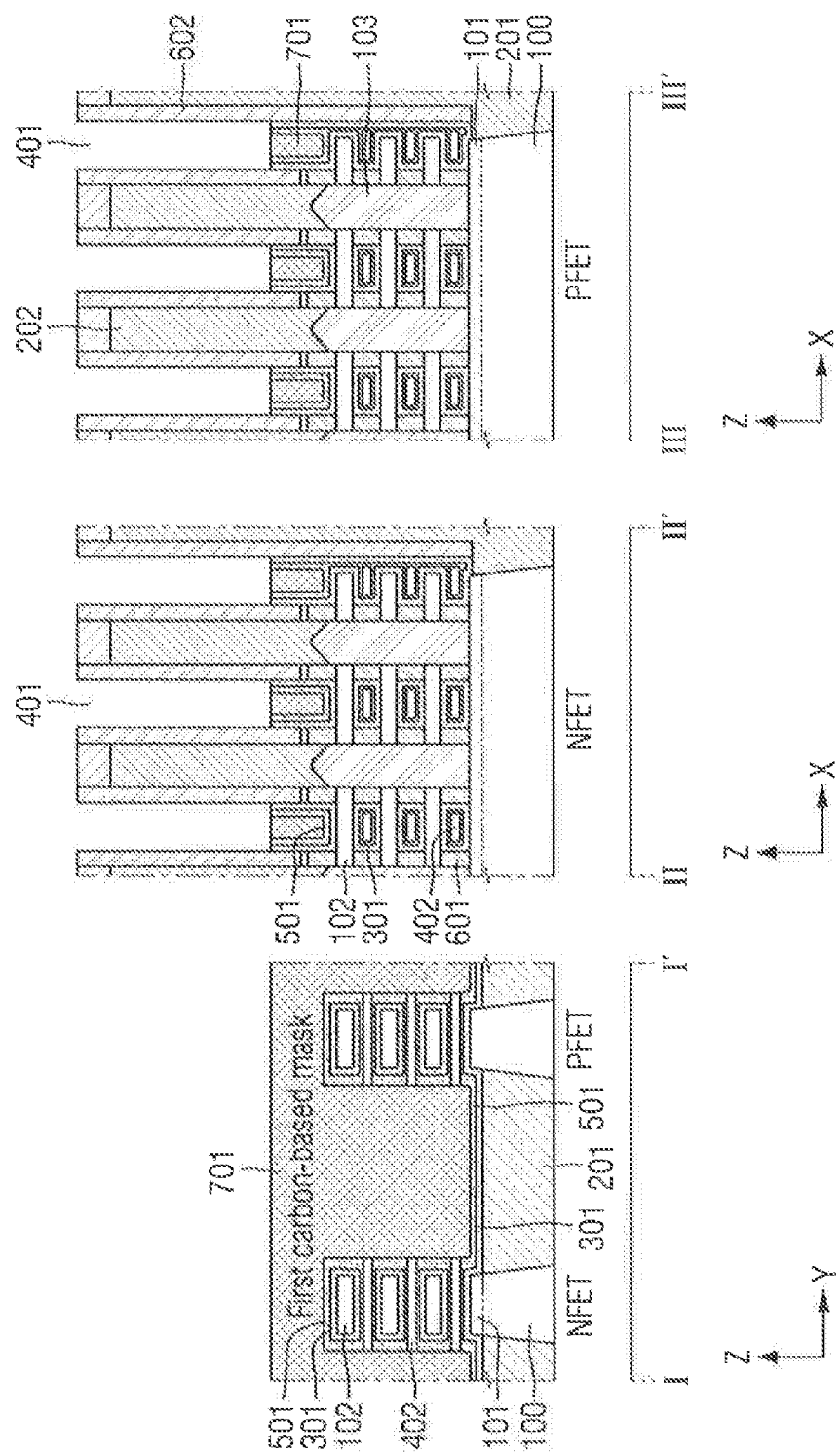
FIG. 4 is a schematic cross-sectional diagram representing first carbon-based mask formed to fill the gate openings to a height covering all the gate all around channels according to an example of the present disclosure.

FIG. 4 is a schematic cross-sectional diagram representing first carbon-based mask formed to fill the gate openings to a height covering all the gate all around channels according to an example of the present disclosure.

Referring to FIG. 1 and FIG. 4, at Block S40 of FIG. 1, first carbon-based mask may be formed in the first and second regions (PFET and NFET regions) by a chemical vapor deposition (CVD) process. As shown in FIG. 4, the first carbon-based mask 701 may be formed in the first and second regions (PFET and NFET regions) by a chemical vapor deposition (CVD) process to fill the plurality of gate openings 401 to a height at least covering all the plurality of gate all around channels 102.

The first carbon-based mask 701 may include, for example, amorphous carbon. The precursor for depositing amorphous carbon may include $C_xH_y$, for example, methane ($CH_4$), ethane ($C_2H_6$), acetylene ($C_2H_2$), or the like, but the present disclosure is not limited thereto. In the deposition process, it may include other process gas such as, for example, $H_2$, or other inert carrier gas such as, for example, helium (He), argon (Ar), nitrogen ($N_2$), or the like. In the process of depositing amorphous carbon as the first-carbon based mask 701 in the first and second regions (PFET and NFET regions), various deposition times, temperatures, and pressures in the CVD process in conjunction with various flow rates of the precursor gas (or gases) and carrier gas (or gases) may be properly used, such that the first-carbon based mask 701 may fill the plurality of gate openings 401 to a height at least covering all the plurality of gate all around channels 102, at the same time, may not fill at all or may fill very little the cave-like gate spaces 402. Since the cave-like gate spaces 402 may not be filled with the first-carbon based mask 701, there is no concern that the gate all around channels 102 may block the etchants to reach the cave-like gate spaces 402 filled with the first carbon-based mask 701 material in a subsequent etching process.

Figure 5:
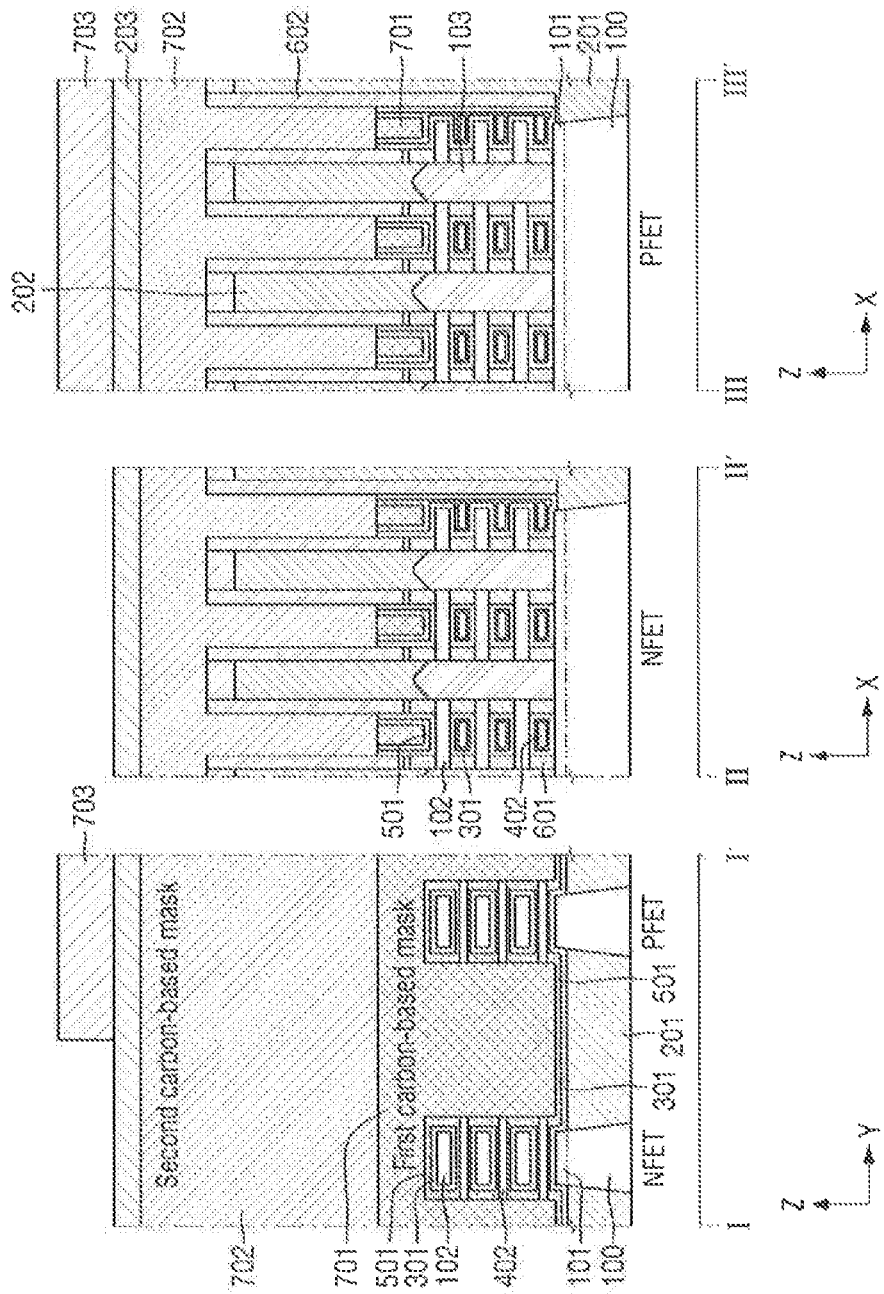
FIG. 5 is a schematic cross-sectional diagram representing second carbon-based mask formed over the first carbon-based mask to a height above the top of the gate openings, with a silicon containing antireflective coating formed over the second carbon-based mask, and a photoresist pattern formed over the silicon containing antireflective coating according to an example of the present disclosure.

FIG. 5 is a schematic cross-sectional diagram representing second carbon-based mask formed over the first carbon-based mask to a height above the top of the gate openings, with a silicon containing antireflective coating formed over the second carbon-based mask, and a photoresist pattern formed over the silicon containing antireflective coating according to an example of the present disclosure.

Referring to FIG. 1 and FIG. 5, at Block S150 of FIG. 1, second carbon-based mask may be formed in the first and second regions (PFET and NFET regions) on top of the first carbon-based mask 701. As shown in FIG. 5, the second carbon-based mask 702 may be formed in the first and second regions (PFET and NFET regions) on top of the first carbon-based mask 701 to a height above the plurality of gate openings 401.

The second carbon-based mask 702 may include a spin-on hard mask layer, may function as a planarization layer, and may have high carbon content. The spin-on hard mask layer may planarize the substrate and may effectively act as a pattern transfer layer. The material for spin-on hard mask may contain a polymer solution as a coating material, in which the polymer(s) may include fused aromatic structure(s), may be soluble in organic solvent, and may become insoluble after coating and curing. The formation of the second carbon-based mask 702 may be carried out with a spin-coating process, so that a planarized carbon mask layer may be obtained, but the present disclosure is not limited thereto. For example, the second carbon-based mask 702 may be formed by, for example, an atomic layer deposition (ALD) process, a chemical vapor deposition (CVD) process, or a physical vapor deposition (PVD) process. To planarize the top surface of the second carbon-based mask 702, a planarization step such as, for example, chemical-mechanical polishing (CMP), may be additionally carried out.

Figure 6:
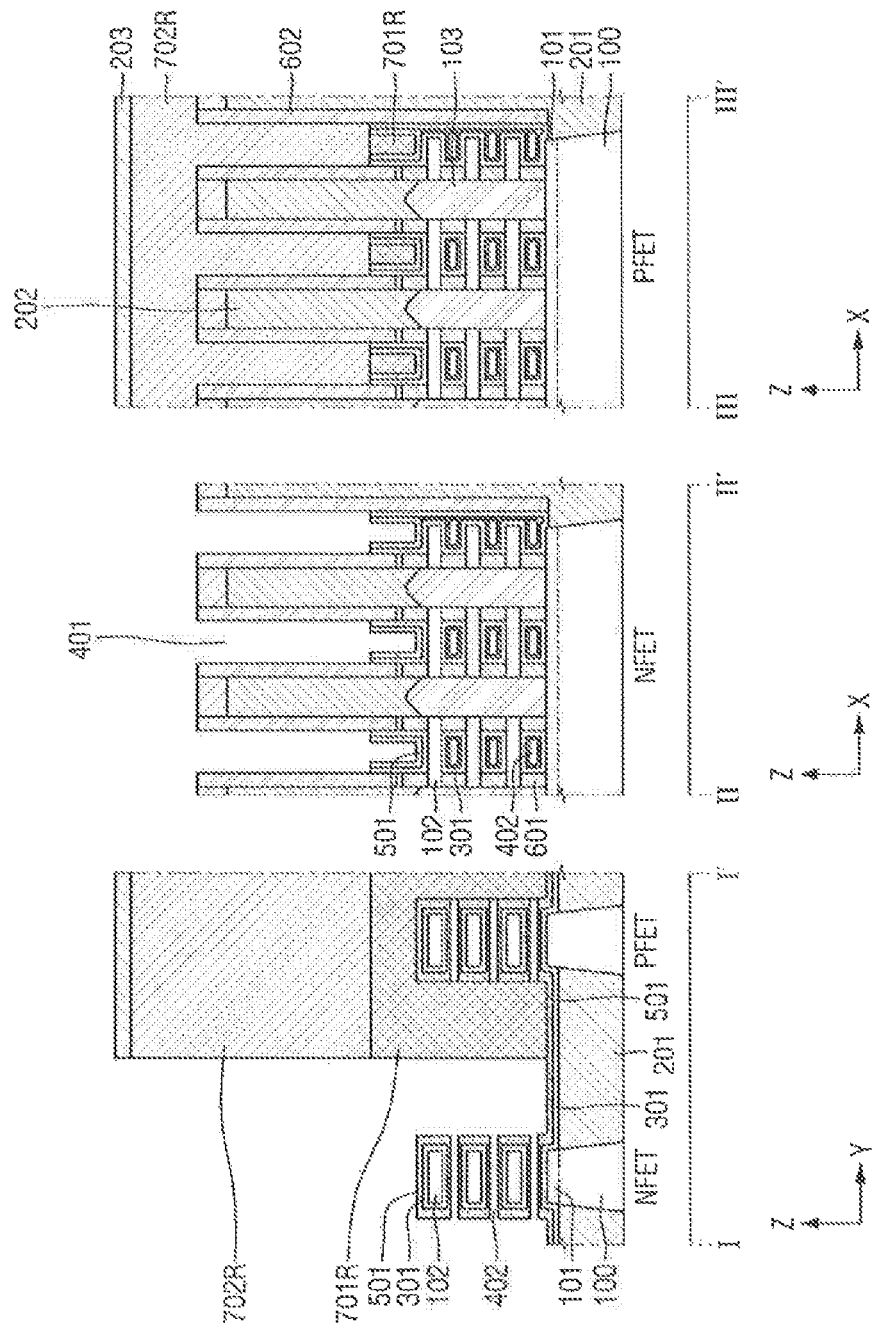
FIG. 6 is a schematic cross-sectional diagram representing the first and second carbon-based masks remained in the first region and being removed in the second region according to an example of the present disclosure.

FIG. 6 is a schematic cross-sectional diagram representing the first and second carbon-based masks remained in the first region and being removed in the second region according to an example of the present disclosure.

Referring to FIG. 1 and FIG. 6, at Block S160 of FIG. 1, the first and second carbon-based masks 701 and 702 in the second region (NFET region) may be removed. FIG. 6 is a schematic cross-sectional diagram representing the first and second carbon-based masks 701 and 702 remained in the first region (PFET region) as remaining first and second carbon-based masks 701R and 702R, and being removed in the second region (NFET region) according to an example of the present disclosure.

Referring to FIG. 5 and FIG. 6, the removal of the first and second carbon-based masks 701 and 702 in the second region (NFET region) may include the following steps: depositing a silicon containing antireflective coating 203 on the second carbon-based mask 702; spin coating a photoresist layer 703 on the silicon containing antireflective coating 203 in the first and second region (PFET and NFET region); exposing the photoresist layer 703 in the first region (PFET region) with a photomask; baking and developing the exposed photoresist layer to form a photoresist layer 703 covering the first region (PFET region); transferring image of the photoresist layer 703 to the silicon containing antireflective coating 203; and performing directional etch to remove the first and second carbon-based masks 701 and 702 in the second region (NFET region) using the imaged silicon containing antireflective coating 203 as an etching mask. However, the present disclosure is not limited to the performance of these steps with the sequence or order presented above. Many steps may also be applied to the substrate before, between or after the steps shown above. In other words, the first and second carbon-based masks 701 and 702 in the second region (NFET region) may be removed through the combination of photolithography process and anisotropic etching process as described in the above process steps.

The exposure of the photoresist layer 703 with a photomask may be carried out with a conventional lithography such as, for example, an ArF (193 nm) deep UV (DUV) immersion lithography. To etch the silicon containing antireflective coating 203, fluorine containing etchant, for example, $CF_4$, $CHF_3$, $CH_2F_2$, $CH_3F$, or any combination thereof, may be used. After etching the silicon containing antireflective coating 203, the etch chemistry may be changed back to etch the first and second carbon-based masks 701 and 702 in the second region (NFET region) using $O_2$ etchant or using a reducing plasma, for example, $N_2$, $H_2$, $NH_3$ or combinations thereof. After finishing the etching of the first and second carbon-based masks 701 and 702 in the second region (NFET region), the photoresist layer 703 covering the first region (PFET region) is usually consumed, and the imaged silicon containing antireflective coating 203 may or may not completely consumed.

Figure 7:
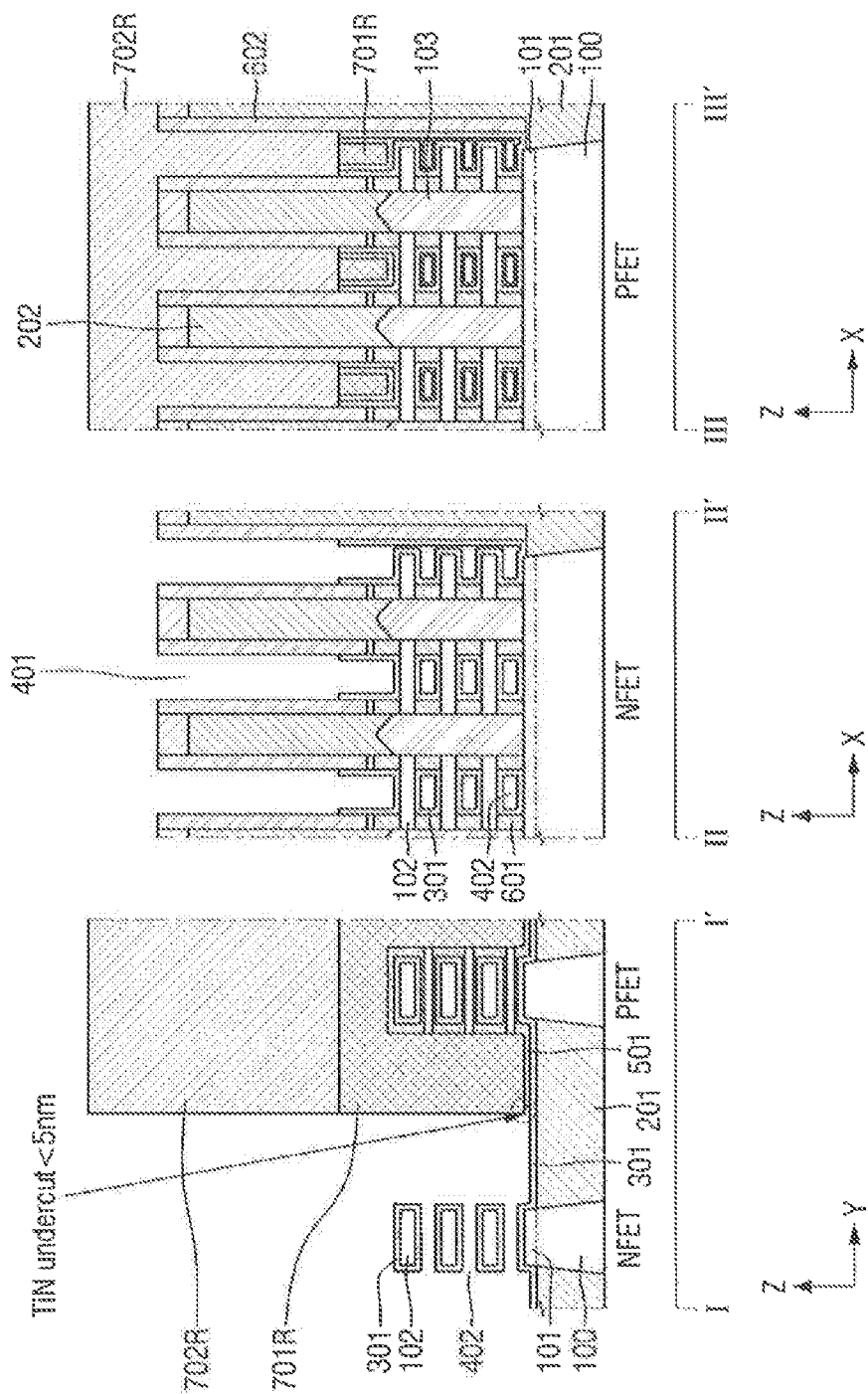
FIG. 7 is a schematic cross-sectional diagram representing the first work function metal in the second region being removed according to an example of the present disclosure.

FIG. 7 is a schematic cross-sectional diagram representing the first work function metal in the second region being removed according to an example of the present disclosure.

Referring to FIG. 1 and FIG. 7, at Block S170 of FIG. 1, the first work function metal (WFM) 501 in the second region (NFET region) may be removed. As shown in FIG. 7, the first WFM 501 in the second region (NFET region) may be removed through etching using the remaining first and second carbon-based masks 701R and 702R in the first region (PFET region) as an etching mask. When the first WFM 501 includes titanium nitride (TiN), directional reactive ion etching (RIE) with chlorine ($Cl_2$) based etchants may be used to remove the titanium nitride (TiN). In the process of removing the first WFM 501 in the second region (NFET region), an undercut of the first WFM 501 may be formed under the remaining first carbon-based mask 701R in the first region (PFET region), and may be less than about 5 nm in length. However, the present disclosure is not limited thereto. For example, when the first WFM 501 is relatively thick, a slightly more undercut with a length slightly larger than 5 nm may occur. In the previous process step S130 of forming the first WFM 501 on the dielectric layer 301, a gap about 1 nm or larger of each of the cave-like gate spaces 402 between two adjacent gate all around channels 102 covered with the first WFM 501 may be formed to allow etchants to reach the inner portion of the cave-like gate spaces 402, to easily remove the first WFM 501 formed within the cave-like gate spaces 402 in this step S170 of removing the first WFM 501 in the second region (NFET region). Since the etchants can reach the inner portion of the cave-like gate spaces 402 to remove the first WFM 501, no excess over etch is required, thus only small undercut of less than about 5 nm in length may be formed. That is, in addition to the removal of the first WFM 501 in the second region (NFET region), less that about 5 nm of the first WFM 501 in the first region (PFET region) may be removed.

Figure 8:
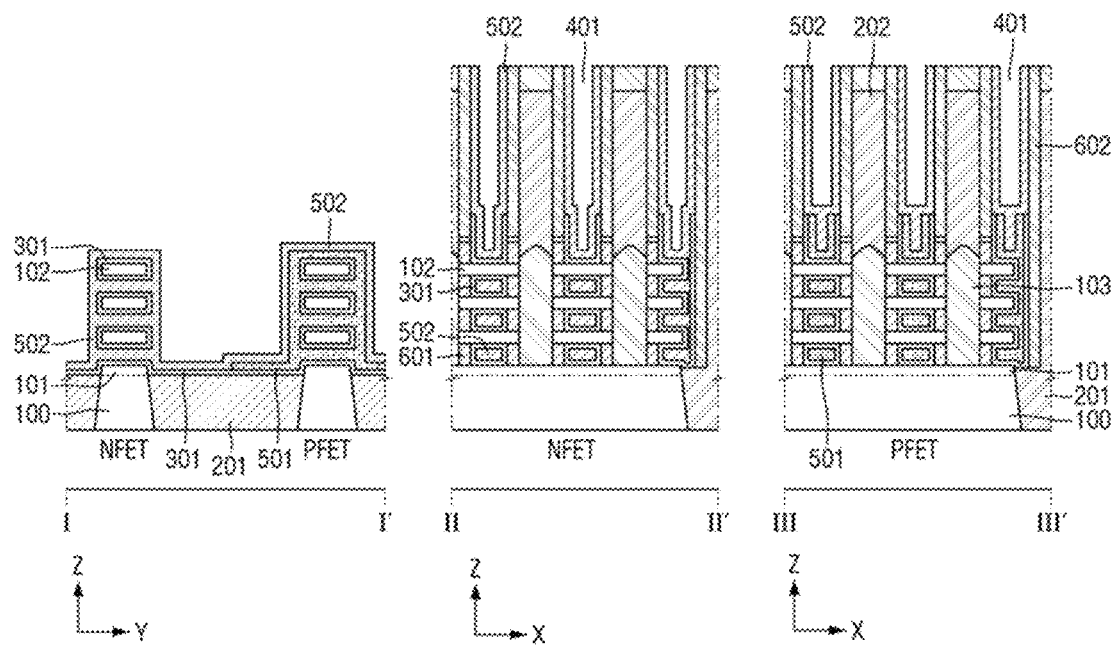
FIG. 8 is a schematic cross-sectional diagram representing second work function metal formed on the dielectric layer in the second region, and formed on the first work function metal in the first region according to an example of the present disclosure.

FIG. 8 is a schematic cross-sectional diagram representing second work function metal formed on the dielectric layer in the second region, and formed on the first work function metal in the first region according to an example of the present disclosure.

Referring to FIG. 1 and FIG. 8, at Block S180 of FIG. 1, the remaining first and second carbon-based masks 701R and 702R in the first region (PFET region) may be removed. The removal of the remaining first and second carbon-based masks 701R and 702R in the first region (PFET region) may be carried out with an isotropic etching using $O_2$ etchant or using a reducing plasma, for example, $N_2$, $H_2$, $NH_3$ or combinations thereof. Other conventional photoresist ashing and/or stripping processes may also be used to remove the remaining first and second carbon-based masks 701R and 702R in the first region (PFET region).

At Block S190 of FIG. 1, a second WFM 502 may be formed on the dielectric layer 301 in the second region (NFET region), and on the first WFM 501 in the first region (PFET region). As shown in FIG. 8, the second WFM 502 may also be formed directly on the second spacers 602 on the sidewalls of the gate openings 401. The second WFM 502 may be n-type WFM (NWFM), and may include, for example, titanium aluminide (TiAl), zirconium aluminide (ZrAl), tungsten aluminide (WAl), tantalum aluminide (TaAl), hafnium aluminide (HfAl), titanium aluminum carbide (TiAlC), or any combination thereof. The second WFM 502 may include multilayer, for example, including titanium nitride/titanium aluminum carbide/titanium nitride (TiN/TiAlC/TiN) or including titanium nitride/titanium aluminum carbide (TiN/TiALC). Before the formation of the second WFM 502, additional first WFM 501 may be formed to completely fill the cave-like gate spaces 402 in the first region (PFET region). When the first WFM 501 is formed to fill the cave-like gate spaces 402 in the first region (PFET region), the first WFM 501 may also be formed in the second region (NFET region), thus the second WFM 502 may then be formed as multilayers. That is, the second WFM 502 may include a thin layer which includes a material of the first WFM 501, and a relatively thicker layer which includes a material of the n-type WFM on top of the thin layer. For example, the first WFM 501 may include TiN, and the second WFM 502 may include TiN/TiAlC/TiN. The second WFM 502 may be formed by, for example, an atomic layer deposition (ALD) process, a chemical vapor deposition (CVD) process, or a physical vapor deposition (PVD) process.

Figure 9:
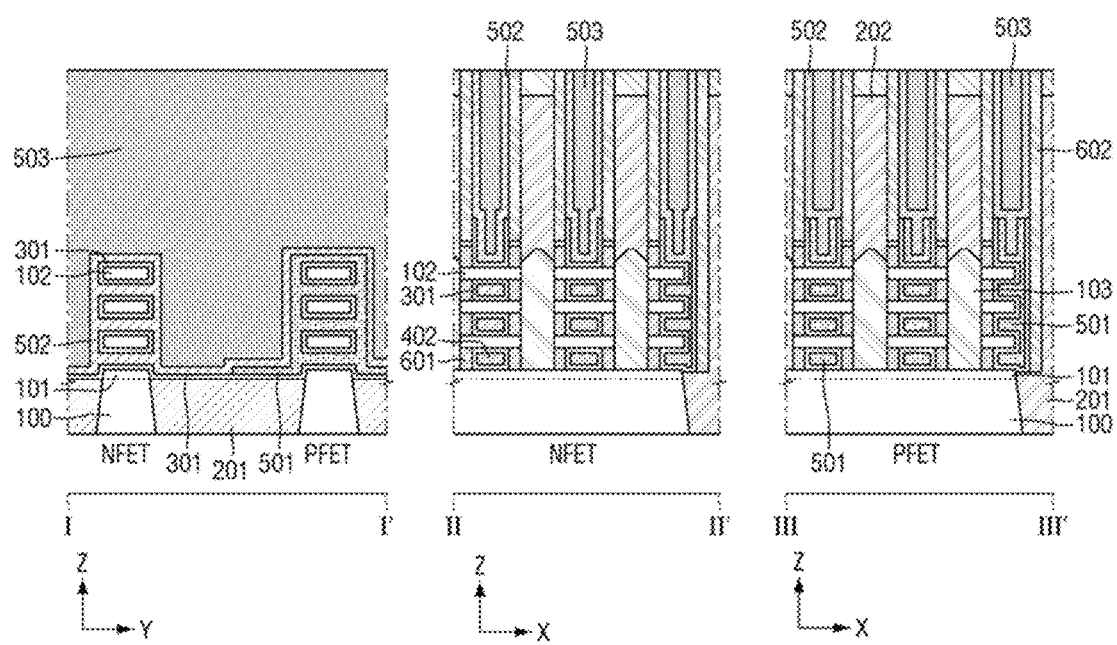
FIG. 9 is a schematic cross-sectional diagram representing gate metal lines formed in the gate openings according to an example of the present disclosure.

FIG. 9 is a schematic cross-sectional diagram representing gate metal lines formed in the gate openings according to an example of the present disclosure.

Referring to FIG. 9, the method of fabricating a gate all around semiconductor device may further include depositing and filling gate metal lines 503 in the plurality of gate openings 401 over the second WFM 502 in the first and second regions (PFET and NFET regions). In the process of filling the gate metal lines 503 in the plurality of gate openings 401 over the second WFM 502 in the first and second regions (PFET and NFET regions), a metal layer may be deposited to fill the gate openings 401, and may then be planarized to form the gate metal lines 503. The metal layer may include a conductive material which may include, for example, gold (Au), titanium (Ti), copper (Cu), silver (Ag), Aluminum (Al), tungsten (W), cobalt (Co), Chromium (Cr), molybdenum (Mo), zirconium (Zr), nickel (Ni), tantalum (Ta), platinum (Pt), or an alloy thereof. The metal layer may be a multilayer, and may include one or more barrier layers, for example, titanium (Ti), titanium nitride (TiN), tantalum (Ta), tantalum nitride (TaN), tungsten nitride (WN) and/or any combination thereof, to prevent the metal from diffusing into the dielectric layer 301. The conductive material may be formed to fill the gate openings 401 with various deposition processes include, but are not limited to: physical vapor deposition (PVD), chemical vapor deposition (CVD), atomic layer deposition (ALD), electrochemical deposition (ECD), electroplating, electroless plating and spin coating. The planarization of the metal layer may include a planarization process, for example, chemical mechanical polishing (CMP) process to planarize the metal layer to form the gate metal lines 503.

According to an example of the present disclosure, a method of fabricating a gate all around semiconductor device may include the following steps: providing a semiconductor substrate 100 having a plurality of gate openings 401 extending across a first region (PFET region) and a second region (NFET region) next to the first region (PFET region), and a plurality of gate all around channels 102 stacked above the semiconductor substrate 100 in each of the plurality of gate openings 401, in which the plurality of gate openings 401 include cave-like gate spaces 402 between the semiconductor substrate 100 and adjacent gate all around channels 102 and between two adjacent gate all around channels 102; forming a dielectric layer 301 in the first and second regions (PFET and NFET regions) on bottom and sidewalls of each of the plurality of gate openings 401, and on and surrounding each of the plurality of gate all around channels 102 and filling a portion of each of the cave-like gate spaces 402; forming first work function metal (WFM) 501 in the first and second regions (PFET and NFET regions) on the dielectric layer 301 with the first WFM 501 filling one other portion of each of the cave-like gate spaces 402, and leaving a gap with a size about 1 nm or larger for each of the cave-like gate spaces 402 between two adjacent gate all around channels 102 covered with the first WFM 501; forming first carbon-based mask 701 in the first and second regions (PFET and NFET regions) by a chemical vapor deposition (CVD) process to fill the plurality of gate openings 401 to a height at least covering all the plurality of gate all around channels 102; forming second carbon-based mask 702 in the first and second regions (PFET and NFET regions) on top of the first carbon-based mask 701 to a height above the plurality of gate openings 401 with planarized top surface; removing the first and second carbon-based masks 701 and 702 in the second region through a photolithography process and an anisotropic etching process; removing the first WFM 501 in the second region (NFET region) through etching using remaining first and second carbon-based masks 701R and 702R in the first region (PFET region) as an etching mask; removing the remaining first and second carbon-based masks 701R and 702R in the first region (PFET region); and forming second WFM 502 on the dielectric layer 301 in the second region (NFET region), and on the first WFM 501 in the first region (PFET region). The semiconductor substrate 100 may or may not include active fins 101. However, the present disclosure is not limited to the performance of these steps with the sequence or order presented above. Many steps may also be applied to the substrate before, between or after the steps shown above.

Before the formation of the second WFM 502, additional first WFM 501 may be formed to completely fill the cave-like gate spaces 402 in the first region (PFET region). When the first WFM 501 is formed to fill the cave-like gate spaces 402 in the first region (PFET region), the first WFM 501 may also be formed in the second region (NFET region). Since the gap of the cave-like gate spaces 402 between two adjacent gate all around channels 102 covered with the first WFM 501 may have a size about 1 nm or larger, for example, in a range of about 1 nm to 8 nm, after filling the gap, a thin layer having about 1 to 8 nm thick of the first WFM 501 may be formed in the second region (NFET region). Subsequently, a thicker layer including a material mainly for the second WFM 502 may be formed on top of the thin layer including a material of the first WFM 501. That is, the second WFM 502 may include multilayers. For example, the first WFM 501 may include TiN, and the second WFM 502 may include TiN/TiAlC/TiN. In an example of the present disclosure, the gate all around semiconductor device may include a p-type work function metal (PWFM) formed on and surrounding the dielectric layer 301 of each gate all around channel 102 in the PFET region, and an n-type work function metal (NWFM) formed on and surrounding the dielectric layer 301 of each gate all around channel 102 in the NFET region, in which the NWFM includes multilayers with one layer including a material of the PWFM and having a thickness in a range of about 1 to 8 nm, for example, in a range of about 1 to 5 nm, and space between one of the gate all around channels 102 including the PWFM in the PFET region and an adjacent one of the gate all around channels 102 including the NWFM in the NFET region has a size smaller than two times of a size including half width of the gate all around channel 102, thickness of the dielectric layer 301, and thickness of the PWFM.

As shown in FIGS. 6 and 7, since a gap with a size about 1 nm or larger for each of the cave-like gate spaces 402 between two adjacent gate all around channels 102 covered with the first WFM 501 exists as shown in an example of the present disclosure, etchants may be able to remove the first WFM 501 in the NFET region through the gap without significantly laterally etching into the PFET region, for example, only forming a small undercut of the first WFM 501 under the remaining first carbon-based mask 701R. However, in a conventional process, since there is no gap remained in the cave-like gate spaces 402 between two adjacent gate all around channels 102 covered with the first WFM 501, to remove the first WFM 501 in the NFET region may require lateral etching of the first WFM 501 in the second direction (Y direction). The conventional process described above may be a process commonly used in the industry, or may be a process disclosed in a related art. The lateral etching length in the second direction (Y direction) required to completely remove the first WFM 501 in the NFET region may be about the same as a length which includes half the width of the gate all around channel 102, the thickness of the dielectric layer 301, and the thickness of the p-type work function metal (PWFM) in the second direction (Y direction). When the first WFM 501 in the NFET region is completely removed, a significant lateral etching of the first WFM 501 may occur in the PFET region with a lateral etching length about the same as a length which includes half the width of the gate all around channel 102, the thickness of the dielectric layer 301, and the thickness of the PWFM in the second direction (Y direction). Thus, when the space between the gate all around channel 102 including the first WFM 501 in the PFET region and the adjacent gate all around channel 102 including the first WFM 501 in the NFET region has a size smaller than two times of a size including half the width of the gate all around channel 102, the thickness of the dielectric layer 301, and the thickness of the first WFM 501, the lateral etch required to completely remove the first WFM 501 in the NFET region may excessively remove and damage the first WFM 501 in the PFET region. Since the thickness of the second WFM 502 (n-type work function metal: NWFM) may be about the same or very close to the thickness of the first WFM 501 (PWFM) in the final structure of the gate all around semi-conductor device, the space between the gate all around channel 102 including the first WFM 501 (PWFM) in the PFET region and the adjacent gate all around channel 102 including the first WFM 501 (PWFM) in the NFET region in the middle of the fabricating process may be about the same or very close to the space between the gate all around channel 102 including the first WFM 501 (PWFM) in the PFET region and the adjacent gate all around channel 102 including the first WFM 501 (PWFM) in the NFET region in the final structure of the gate all around semiconductor device. Thus, the conventional process described above may not be able to fabricate a gate all around semiconductor device including a space, between one of the gate all around channels 102 including the PWFM in the PFET region and an adjacent one of the gate all around channels 102 including the NWFM in the NFET region, having a size smaller than two times of a size including half the width of the gate all around channel 102, the thickness of the dielectric layer 301, and the thickness of the PWFM, without excessively removing and damaging the PWFM in the PFET region.

Lithography variations may further limit the capability of the conventional method described above to fabricate the gate all around semiconductor device with the dimension described above. Due to the excessive lateral etch required to completely remove the PWFM in the NFET region, the above described conventional process may not be able to fabricate a gate all around semiconductor device including a space, between one of the gate all around channels 102 including the PWFM in the PFET region and an adjacent one of the gate all around channels 102 including the NWFM in the NFET region, having a size smaller than a size including half the width of gate all around channel 102, the thickness of the dielectric layer 301, and the thickness of the PWFM. The methods in the example embodiments of the present disclosure described above may overcome this excessive lateral etch issue, and may be used to fabricate the gate all around semiconductor device with the reduced dimension described above. According to an example of the present disclosure, the gate all around semiconductor device may include a PWFM formed on and surrounding the dielectric layer 301 of each gate all around channel 102 in the PFET region, and an NWFM formed on and surrounding the dielectric layer 301 of each gate all around channel 102 in the NFET region, in which the NWFM includes multilayers with one layer including a material of the PWFM and having a thickness in a range of about 1 to 8 nm, for example, in a range of about 1 to 5 nm, and space between one of the gate all around channels 102 including the PWFM in the PFET region and an adjacent one of the gate all around channels 102 including the NWFM in the NFET region has a size smaller than a size including half width of the gate all around channel 102, thickness of the dielectric layer 301, and thickness of the PWFM. The material for the PWFM may include, for example, tungsten nitride (WN), ruthenium nitride (RuN), molybdenum nitride (MoN), titanium nitride (TiN), tantalum nitride (TaN), titanium aluminum nitride (TiAlN), tantalum aluminum nitride (TaAlN), tungsten carbide (WC), tantalum carbide (TaC), titanium carbide (TiC), or any combination thereof, and the material for the n-type work function metal may include, for example, titanium aluminide (TiAl), zirconium aluminide (ZrAl), tungsten aluminide (WAl), tantalum aluminide (TaAl), hafnium aluminide (HfAl), titanium aluminum carbide (TiAlC), or any combination thereof. For example, the PWFM of the gate all around semiconductor device may include TiN, and the NWFM may include TiN/TiAlC/TiN.

As described above, example embodiments of the present disclosure provide a method of fabricating a gate all around semiconductor device, for example, a FinFET, by depositing a carbon-based mask, which can be subsequently etched easily, using a chemical vapor deposition (CVD) process to the gate all around structure, and a method of fabricating a gate all around semiconductor device by depositing the first WFM to surround the gate all around channels and to fill the cave-like gate spaces while leaving a gap with a size about 1 nm or larger for each of the cave-like gate spaces for subsequently easy etching of the carbon-based masks and the first WFM. Thus, the gate all around semiconductor devices with reduced sizes may be fabricated. In the gate all around semiconductor device, the NWFM may include multilayers with one thin layer including a material of the PWFM.

Although illustrative embodiments of the present disclosure have been described in detail, it should be understood that the present disclosure is not intended to be limited to the specific example embodiments disclosed. Based on the foregoing disclosure, those skilled in the art will be able to make various changes, substitutions and alterations without departing from the spirit and scope of the present disclosure as defined by the following appended claims.

What is claimed is:

1. A method of fabricating a gate all around semiconductor device comprising:
providing a semiconductor substrate having a plurality of active fins extending in a first direction in a first region and a second region next to the first region, a plurality of gate all around channels stacked above each of the plurality of active fins, and a plurality of gate openings extending in a second direction across the first and second regions and crossing the plurality of active fins, wherein the plurality of gate openings comprise cave-like gate spaces, with some of the cave-like gate spaces each located between each of the plurality of active fins and one adjacent gate all around channel and some of the cave-like gate spaces each located between two adjacent gate all around channels;
forming a dielectric layer in the first and second regions on bottom and sidewalls of each of the plurality of gate openings, and on and surrounding each of the plurality of gate all around channels and filling a first portion of each of the cave-like gate spaces;
forming a first work function metal in the first and second regions on the dielectric layer with the first work function metal filling a second portion of each of the cave-like gate spaces;
forming a first carbon-based mask in the first and second regions by a chemical vapor deposition (CVD) process to fill the plurality of gate openings to a height at least covering all the plurality of gate all around channels;
forming a second carbon-based mask in the first and second regions on top of the first carbon-based mask to a height above the plurality of gate openings;
removing the first and second carbon-based masks in the second region;
removing the first work function metal in the second region through etching using remaining first and second carbon-based masks in the first region as an etching mask;
removing the remaining first and second carbon-based masks in the first region; and
forming second work function metal on the dielectric layer in the second region, and on the first work function metal in the first region.

2. The method of claim 1, wherein after the forming of the first work function metal, a gap of each of the cave-like gate spaces between two adjacent gate all around channels covered with the first work function metal is larger than or equal to 1 nm.

3. The method of claim 1, wherein before the forming of the second work function metal, additional first work function metal is formed to completely fill the cave-like gate spaces in the first region.

4. The method of claim 1, wherein the forming of the second carbon-based mask is carried out with a spin-coating process.

5. The method of claim 1, wherein the first region is p-type field effect transistor region and the second region is n-type field effect transistor region.

6. The method of claim 1, wherein the first carbon-based mask includes amorphous carbon.

7. The method of claim 1, wherein the removing of the first and second carbon-based masks in the second region comprises:
depositing a silicon containing antireflective coating on the second carbon-based mask;
spin coating a photoresist layer on the silicon containing antireflective coating;
exposing the photoresist layer with a photomask;
baking and developing the exposed photoresist layer to form a photoresist pattern covering the first region;
transferring image of the photoresist pattern to the silicon containing antireflective coating; and
performing directional etch to remove the first and second carbon-based masks in the second region using the imaged silicon containing antireflective coating as an etching mask.

8. The method of claim 1, wherein in the removing of the first work function metal in the second region, an undercut of the first work function metal formed under the remaining first carbon-based mask is less than 5 nm in length.

9. The method of claim 1, wherein the first work function metal is a p-type work function metal including titanium nitride (TiN), and the second work function metal is a n-type work function metal including titanium nitride/titanium aluminum carbide/titanium nitride (TiN/TiAlC/TiN).

10. The method of claim 1, wherein in the forming of the first carbon-based mask in the first and second regions by CVD process, the first carbon-based mask does not fill the cave-like gate spaces.

11. The method of claim 1, further comprising depositing and filling gate metal lines in the plurality of gate openings over the second work function metal in the first and second regions.

12. A method of fabricating a gate all around semiconductor device comprising:
providing a semiconductor substrate having a plurality of gate openings extending across a first region and a second region next to the first region, and a plurality of gate all around channels stacked above the semiconductor substrate in each of the plurality of gate openings, wherein the plurality of gate openings comprise cave-like gate spaces, with some of the cave-like gate spaces located between the semiconductor substrate and adjacent gate all around channels and some of the cave-like gate spaces each located between two adjacent gate all around channels;
forming a dielectric layer in the first and second regions on bottom and sidewalls of each of the plurality of gate openings, and on and surrounding each of the plurality of gate all around channels and filling a first portion of each of the cave-like gate spaces;
forming a first work function metal in the first and second regions on the dielectric layer with the first work function metal filling a second portion of each of the cave-like gate spaces, and leaving a gap with a size larger than or equal to 1 nm for each of the cave-like gate spaces between two adjacent gate all around channels covered with the first work function metal;
forming a first carbon-based mask in the first and second regions by a chemical vapor deposition (CVD) process to fill the plurality of gate openings to a height at least covering all the plurality of gate all around channels;

forming a second carbon-based mask in the first and second regions on top of the first carbon-based mask to a height above the plurality of gate openings with planarized top surface;

removing the first and second carbon-based masks in the second region through a photolithography process and an anisotropic etching process;

removing the first work function metal in the second region through etching using remaining first and second carbon-based masks in the first region as an etching mask;

removing the remaining first and second carbon-base masks in the first region; and forming second work function metal on the dielectric layer in the second region, and on the first work function metal in the first region.

13. The method of claim 12, wherein before the forming of the second work function metal, additional first work function metal is formed to completely fill the cave-like gate spaces in the first region.

14. The method of claim 12, wherein the first carbon-based mask includes amorphous carbon.

15. The method of claim 12, wherein in the removing of the first work function metal in the second region, an undercut of the first work function metal under the first carbon-based mask is less than 5 nm in length.

16. The method of claim 12, wherein the first work function metal is a p-type work function metal including TiN, and the second work function metal is a n-type work function metal including TiN/TiAlC/TiN.

17. The method of claim 12, wherein the first region is p-type field effect transistor region and the second region is n-type field effect transistor region.

* * * * *